(12) United States Patent
Chu et al.

(10) Patent No.: US 9,307,673 B2
(45) Date of Patent: Apr. 5, 2016

(54) POWER SUPPLY HAVING DETACHABLE FAN

(71) Applicant: ECHOSTREAMS INNOVATIVE SOLUTIONS, LLC, Arcadia, CA (US)

(72) Inventors: Chang-Feng Chu, New Taipei (TW); Gene Jingluen Lee, New Taipei (TW)

(73) Assignee: ECHOSTREAMS INNOVATIVE SOLUTIONS,LLC, Arcadia, CA (US)

( * ) Notice: Subject to any disclaimer, the term of this patent is extended or adjusted under 35 U.S.C. 154(b) by 121 days.

(21) Appl. No.: 14/225,738

(22) Filed: Mar. 26, 2014

(65) Prior Publication Data

US 2015/0208548 A1 Jul. 23, 2015

(30) Foreign Application Priority Data

Jan. 22, 2014 (TW) .............................. 103201313 U

(51) Int. Cl.
| | |
|---|---|
| G06F 1/20 | (2006.01) |
| H05K 5/00 | (2006.01) |
| H05K 7/20 | (2006.01) |
| H01L 23/467 | (2006.01) |

(52) U.S. Cl.
CPC .......... *H05K 7/20172* (2013.01); *H01L 23/467* (2013.01); *H01L 2924/0002* (2013.01)

(58) Field of Classification Search
CPC .................. H01L 2924/0002; H01L 2924/00; H01L 23/467; H01L 23/4093; H01L 23/427; H01L 23/4006; G06F 1/20; G06F 1/183; G06F 1/187; H05K 7/20172; H05K 7/1425; H05K 7/1489; H05K 7/20727; H05K 7/20581
USPC ................................ 361/679.48–679.51, 695
See application file for complete search history.

(56) References Cited

U.S. PATENT DOCUMENTS

| | | | | |
|---|---|---|---|---|
| 6,031,719 A * | 2/2000 | Schmitt | .............. | H05K 7/20172 165/80.3 |
| 6,213,819 B1 * | 4/2001 | Fan | ........................ | F04D 29/601 361/695 |
| 6,316,718 B1 * | 11/2001 | Lin | ..................... | H05K 7/20172 174/17 VA |
| 2003/0221291 A1 * | 12/2003 | Stewart | .............. | H05K 7/20172 16/422 |
| 2005/0105269 A1 * | 5/2005 | Chen | .................. | H05K 7/20172 361/695 |
| 2006/0203447 A1 * | 9/2006 | Kyle | .................. | H05K 7/20172 361/695 |
| 2007/0035924 A1 * | 2/2007 | Westphall | ................. | G06F 1/20 361/679.48 |
| 2012/0145877 A1 * | 6/2012 | Chiu | ......................... | G06F 1/20 248/674 |
| 2013/0155609 A1 * | 6/2013 | Kuo | .................... | H05K 7/20172 361/679.48 |

* cited by examiner

*Primary Examiner* — Adam B Dravininkas
(74) *Attorney, Agent, or Firm* — Li & Cai Intellectual Property (USA) Office

(57) ABSTRACT

A power supply having detachable fan includes a power supply main body and a fan module. The power supply main body includes a shell. Walls of the shell define at least one compartment, and the walls have at least one fastening portion. The fan module includes a case, a fan and a handle. The case has an outlet and an inlet. The case is movably disposed in the compartment, and the inlet faces an interior of the shell. The fan is disposed in between the outlet and the inlet. The handle is pivotally connected to two sides of the outlet of the case, and two ends of the handle respectively have a mating portion. The mating portion and the fastening portion of the immediately adjacent wall of the shell are engaged.

6 Claims, 6 Drawing Sheets

POWER SUPPLY HAVING DETACHABLE FAN

BACKGROUND

1. Field of the Invention

The instant disclosure relates to a power supply; in particular, to a power supply having independently detachably fan.

2. Description of Related Art

Most electronic products having embedded power supply to generate the power. Power supply creates considerable heat under operation. However, the electronic components inside the power supply are prone to change their property because of the heat. For example, a capacity unit may alter its capacity coefficient under high temperature or even cause permanent damage. Therefore when the power supply has abnormally high temperature, it is easy to fall into malfunctioning or burn down.

Because power supply is a critical component to an electronic product, when the power supply stops operating, the electronic product operation is interrupted as well. Therefore the heat dissipation of power supply is a great concern in the industry.

Most of the computer server systems have discrete power supply and system cooling fans which result in more electronic wastes. The number of cooling fans is another issue. Some power supplies have only one cooling fan per module, while some use many fans together to transmit the heat out of the power supply. If the number of fan is high, it generates a lot of induced vibration, leading to hard disk instability. If there is only one fan per module, the efficiency of heat dissipation may be compromised and there is not a backup fan when the only fan is malfunctioned. In many of the systems, the system cooling fans are much bigger in size than the power supply cooling fans and produce strong air pressure. The strong air pressure results in negative pressure on power supply cooling fans, leading to less effective ventilation. In addition, the smaller power supply cooling fans run at high speed to generate airflow, and this running mode may cause considerable acoustic noise and vibration within the system. When a power supply fan fails, the entire power supply has to be removed for replacement because of a single point of failure.

To address the above issues, the inventor strives via associated experience and research to present the instant disclosure, which can effectively improve the limitation described above.

BRIEF SUMMARY OF THE INVENTION

The instant disclosure intends to resolve the abovementioned fan removal issue.

The instant disclosure provides a power supply having detachable fan. The power supply includes a power supply main body and a fan module. The power supply main body includes a shell. Walls of the shell define at least one compartment, and the walls have at least one fastening portion. The fan module includes a case, a fan and a handle. The case has an outlet and an inlet. The case is movably disposed in the compartment, and the inlet faces an interior of the shell. The fan is disposed in between the outlet and the inlet. The handle is pivotally connected to two sides of the outlet of the case, and two ends of the handle respectively have a mating portion. The mating portion and the fastening portion of the immediately adjacent wall of the shell are engaged.

The instant disclosure provides the following advantages: the power supply and system fans are integrated to reduce discrete parts and electronic wastes. More than one fan serves per power supply so as to have replacement fans when any one of the fans fails. Furthermore, the fans spin at a slower speed, such that the vibration caused by fan operation over the hard disk drives is greatly reduced and the acoustic noise is minimized. Since the power supply and the system share one set of fans, air pressure interference among power supply and system cooling fans is avoided. Additionally, a plurality of compartments is created within the shell, and the fan module is disposed in one single compartment. When one of the fan modules is out of order, only the very fan module is removed (hot swap) and the remaining fan module does not need to be removed.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE INVENTION

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
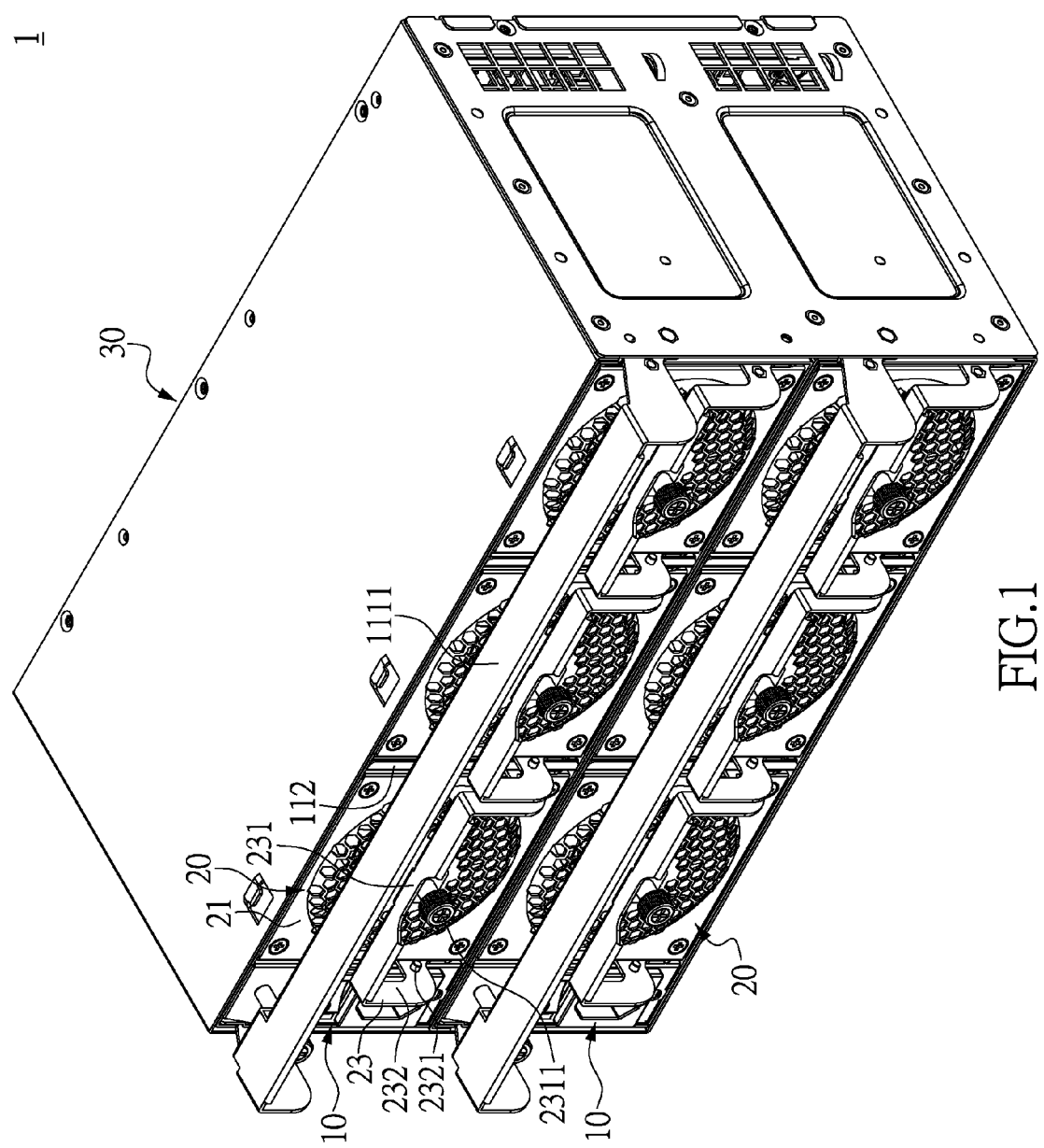
FIG. 1 is a perspective view showing a power supply having detachable fan in accordance with an embodiment of the instant disclosure.

Please refer to FIG. 1. The instant disclosure provides a power supply having detachable fan 1 (hereinafter the power supply having detachable fan 1 is referred to as the power supply 1). The power supply 1 includes a power supply main body 10, a plurality of fan modules 20 and an combination case 30. The power supply main body 10 and the fan module 20 are detachably disposed in the combination case 30. The fan modules 20 are detachably disposed in the power supply main body 10 and a portion of the fan modules 20 are exposed on the power supply main body 10. Because when the power supply main body 10 operates, considerable heat will be generated, the fan modules 20 drain the heat out of the power supply main body 10 to avoid the power supply main body being overheated and components therein being damaged.

Please refer to FIG. 1. The combination case 30 has two sets of power supplies 10, one of which serves as a main power and the other as a backup, such that when the main power supply is not working, the electronic product does not shut down automatically.

Figure 2:
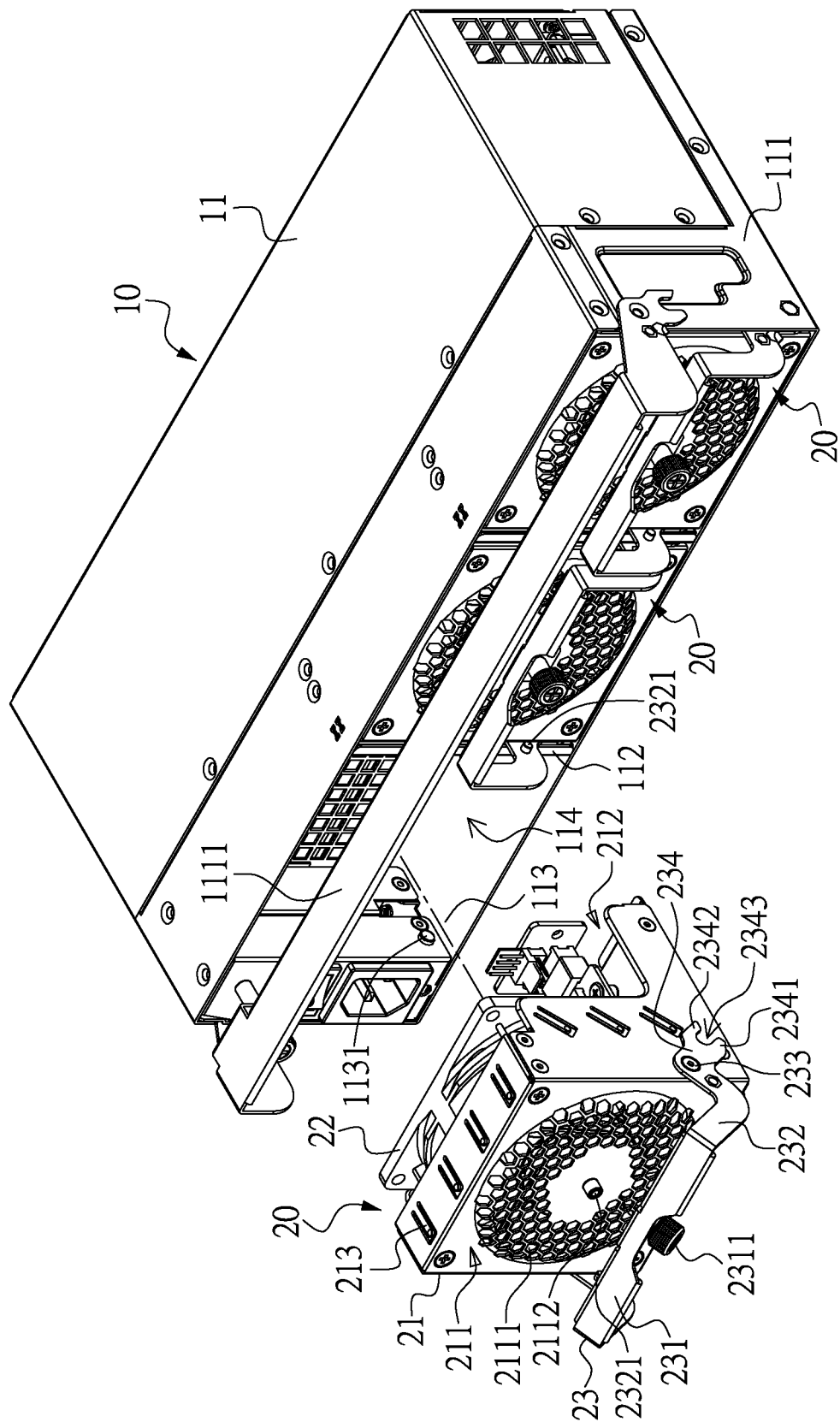
FIG. 2 is an exploded view showing a power supply having detachable fan in accordance with an embodiment of the instant disclosure.
Figure 6:
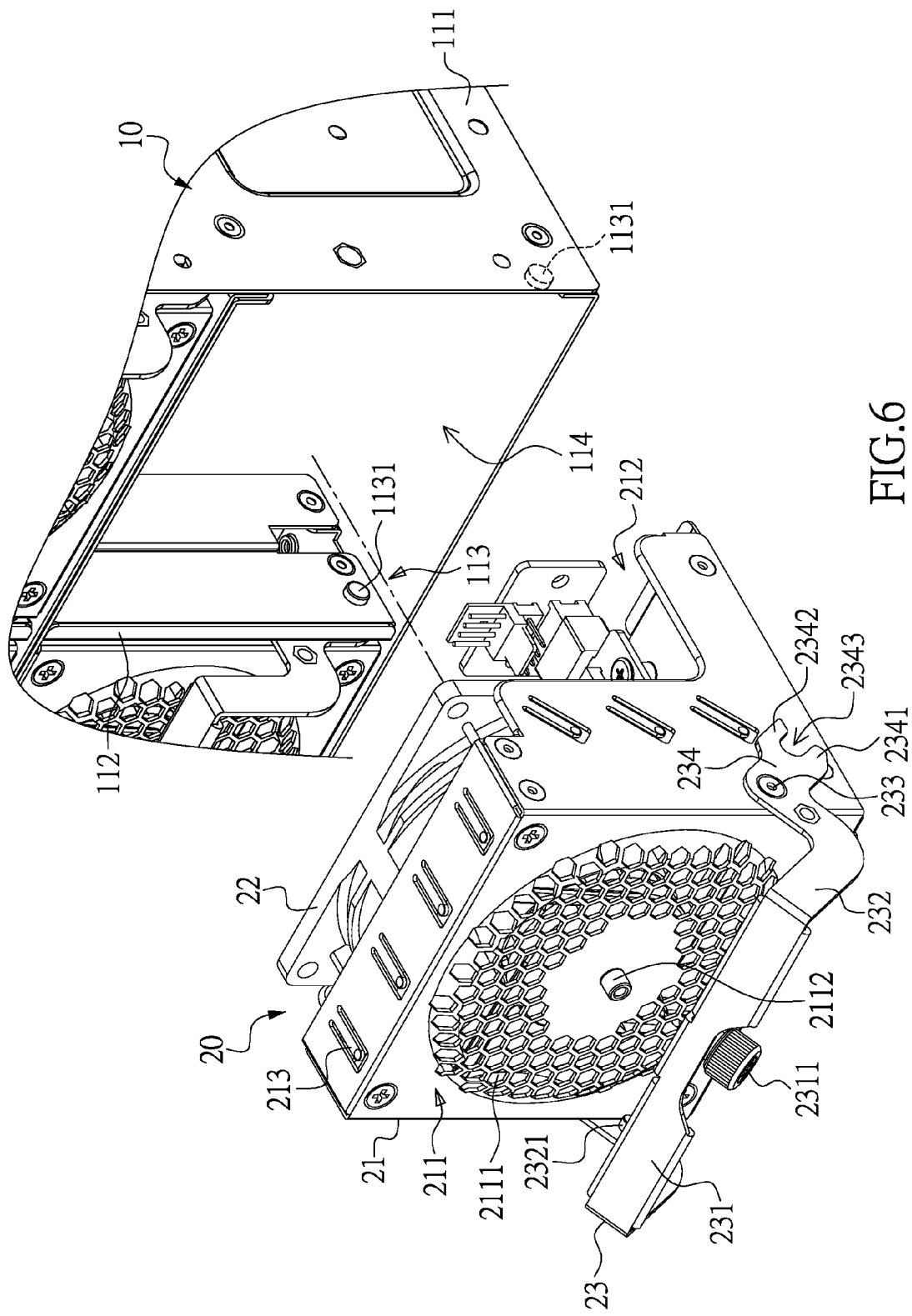
FIG. 6 is a schematic diagram showing a power supply having detachable fan at a third state in accordance with an embodiment of the instant disclosure.

Please refer to FIG. 2. The power supply main body 10 includes a shell 11. Two sides of the shell 11 are designated as side walls 111. The shell 11 has a plurality of compartment walls 112. The compartment wall 112 and the side wall 111 collectively define a compartment 114. Every two adjacent compartment walls 112 also define a compartment 114. In other words, the shell 11 has a plurality of compartments 114 defined by side walls 111 and compartment wall 112. The inner side of the side wall 111 is formed with a fastening portion 113. In the instant embodiment, the fastening portion 113 has a fastening pillar 1131. Two sides of the compartment wall 112 also have the fastening pillars 1131 respectively (as shown in FIG. 6). A handle 1111 is pivotally connected to the side wall 111 which serves to fasten the combination case 30.

Figure 3:
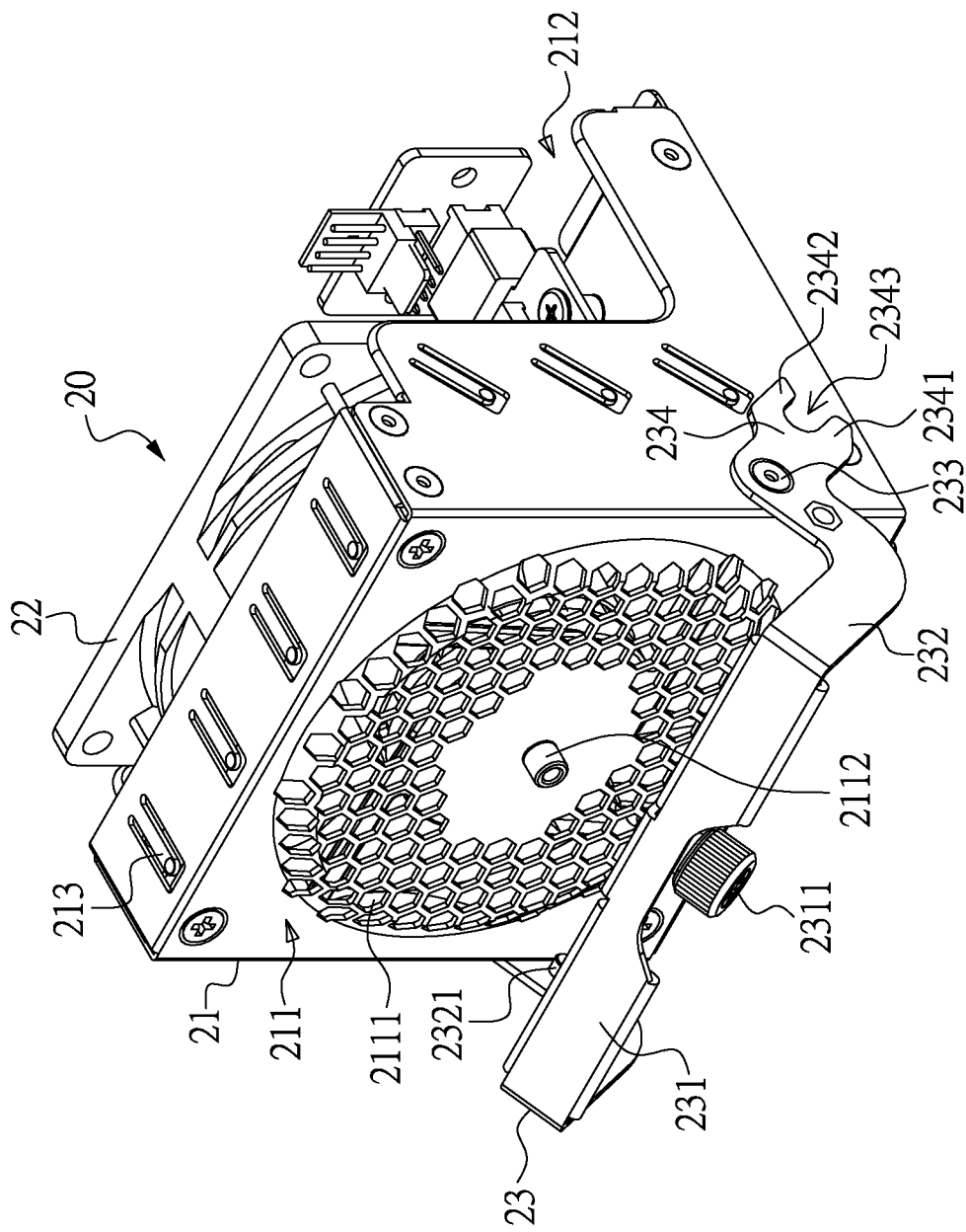
FIG. 3 is a schematic diagram showing a fan module of a power supply having detachable fan in accordance with an embodiment of the instant disclosure.

Please refer to FIG. 3. The fan module 20 includes a case 21, a fan 22 and a handle 23. The fan 22 is disposed within the case 21. The handle 23 is pivotally connected to an outer face of the case 21. The case 21 is made of electrically conductive material. The case 21 has an outlet 211 and an inlet 212. As can be seen in FIG. 3, the outlet 211 is a solid wall formed with a plurality of heat dissipation holes 2111. The inlet 212 is configured as an opening. The outer face of the outlet 211 has a coupling portion 2112. In addition, the outer face of the case 21 is formed with a plurality of flexible electrically conductive arms 213. The fan 22 is disposed in the case 21 and in between the outlet 211 and the inlet 212.

The handle 23 has a holding portion 231, and two ends of the holding portion 231 bend and extend to form extensions 232. One end of the extension 232 bends to form a mating portion 234. A shaft 233 is disposed in between the extension 232 and the mating portion 234. The holding portion 231, extension 232 and the mating portion 234 are configured as plate shape. The normal lines of the holding portion 231 and the extension 232 are perpendicular. The normal lines of the extension 232 and the mating portion 234 are parallel. Further, the length of the mating portion 234 is substantially the same as that of the outlet 211. The holding portion 231 is positioned outside the outlet 211. Because the length of the holding portion 231 and that of the outlet 211 are substantially the same, the two extensions are aligned at two sides of the outlet 211, and therefore the handle 21 is pivotally connected to two sides of the outlet 211 of the case 21 by the shaft 234.

The mating portion 234 extends to form a first mating arm 2341 and a second mating arm 2342. The first mating arm 2341 is positioned closer to the outlet 211 than the second mating arm 2342. The first mating arm 2341 and the second mating arm 2342 are spaced apart, such that a passage is formed between the first mating arm 2341 and the second mating arm 2342, and the free ends of first mating arm 2341 and the second mating arm 2342 are not connected. Therefore the free end of the mating portion 234 is formed with a notch 2343.

Please refer to FIG. 3. The holding portion 231 has a coupling element 2311 that corresponds to the coupling portion 2112 of the outlet 211. In the instant embodiment, the coupling element 2311 and the coupling portion 2112 are a set of a screw and a screw receiver which can be hand fastened. The inner side of the two extensions 232 has an alignment pillar 2321 (please refer to FIG. 1) respectively. The handle 1111 of the side wall 111 and the handle 23 of the fan module 20 are substantially the same.

Figure 4:
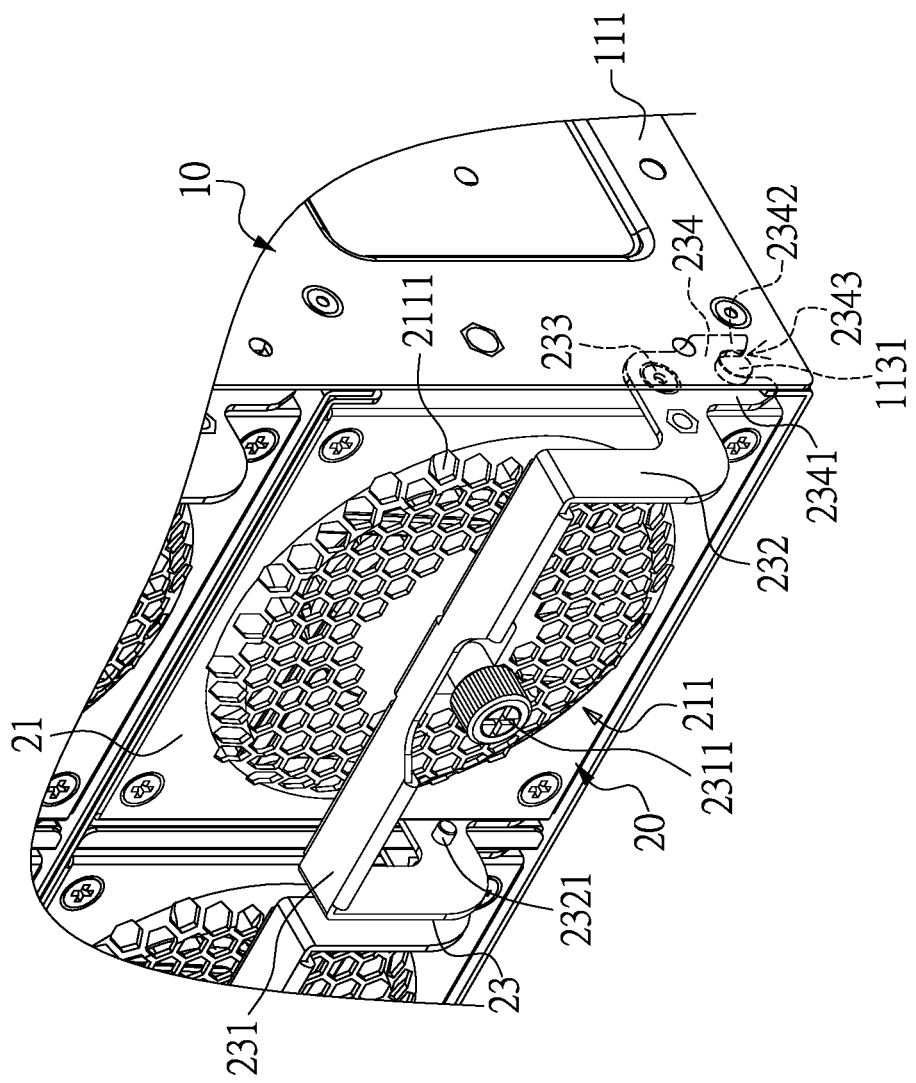
FIG. 4 is a schematic diagram showing a power supply having detachable fan at a first state in accordance with an embodiment of the instant disclosure.
Figure 5:
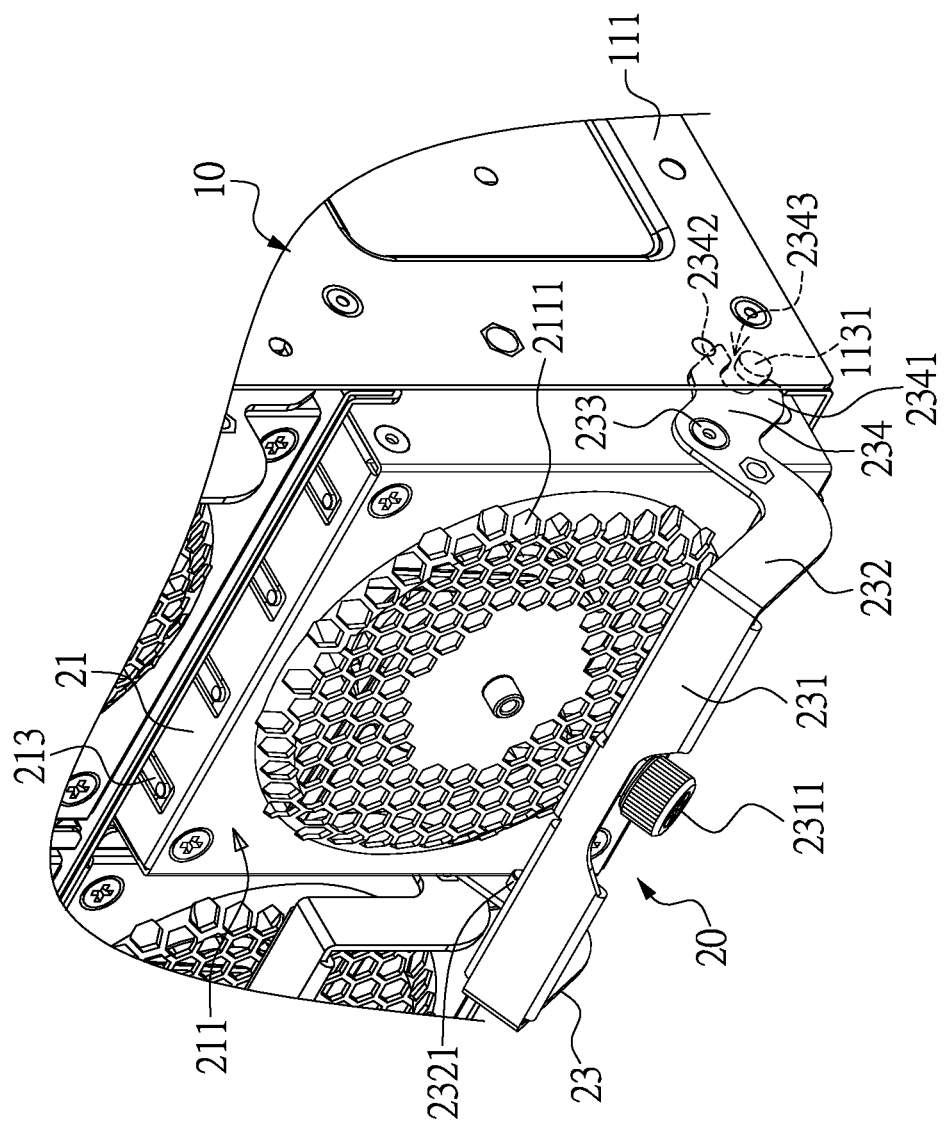
FIG. 5 is a schematic diagram showing a power supply having detachable fan at a second state in accordance with an embodiment of the instant disclosure.

In FIGS. 4 to 6, the handle 1111 of the side wall 111 is omitted. The omission of the handle 1111 in the drawing is to show a clearer view of the interaction between the fan module 20 and the shell 11, and the handle 1111 is still present in the embodiment. Please refer to FIGS. 4 to 6. The fan module 20 has three states in relation to the shell 11 (please refer to FIG. 1). Each of the fan modules 20 is disposed in a compartment 114. Therefore, when one fan module 20 is not working properly, that fan module 20 can be disengaged for maintenance or replacement. Unlike the conventional power supply the entire set of fan has to be dislodged for any repair. Moreover, the electrical connection between the fan module 20 and the power supply main body may be hot swapping, such that under the replacement of the fan module 20, the power supply 1 can still undergo normal operation.

Please refer to FIG. 4. The fan module 20 is at the first state. The case 21 is disposed in the compartment 114 of the shell 11 (please refer to FIG. 6). The normal line of the holding portion 231 is perpendicular to the normal line of the outlet 211. In addition, the holding portion 231 is at the closest distance to the outlet 211, and the coupling element 2311 and the coupling portion 2112 are connected. The fastening pillar 1131 is positioned in between the first mating arm 2341 and the second mating arm 2342. Without any external force interruption, the force between the first mating arm 2341 and the fastening pillar 1131 is the same as the force between the second mating arm 2342 and the fastening pillar 1131, and the notch faces toward the bottom face of the case 21. When the holding portion 231 is pulled outwardly, the second mating arm 2341 abuts the fastening pillar 1131 to limit the case 21 from moving outwardly. Furthermore, the flexible electrically conductive arm 213 flexibly abuts the inner face of the shell 11, such that the case 21 and the shell 11 are connected, and therefore it is seamless in between the power supply main body 10 and the fan module 20 so as to prevent any leakage of the electromagnetic interference (EMI). In other words, the placement of the flexible electrically conductive arm 213 prevents the leakage of EMI that is generated between the fan module 20 and the power supply main body 10.

Please refer to FIG. 5. The fan module 20 is at the second state. The case 21 is exposed on the shell 11. The coupling element 2311 and the couple portion 2112 are separated. The holding portion 231 and the outlet 211 are spaced apart. The force between the first mating arm 2341 and the fastening pillar 1131 is greater than that between the second mating arm 2342 and the fastening pillar 1131. The notch 2343 is positioned slightly toward the inlet 212. In addition, the alignment pillar 2321 abuts the outlet 211 to avoid the handle 23 being over rotated. If the handle 23 is over swung, the force between the first mating arm 2341 and the fastening pillar 1131 becomes too large, and the first mating arm 2341 is likely to break. Please refer to FIG. 6. The fan module 20 is at the third state, and the fan module 20 and the shell 11 are separated.

Please refer to FIGS. 4 and 5. When the fan module 20 switches from the first state to the second state, the handle 23 rotates about the shaft 233. In the rotation, the first mating arm 2341 abuts the fastening pillar 1131, the force exerted by the first mating arm 2341 and the fastening pillar 1131 pushes the case 21 outwardly. Because of the orientation of the notch 2343 in the second state, the fan module 20 can be completely removed from the shell 11 and enter the third state. Therefore, by the force exerted between the first mating arm 2341 and the fastening pillar 1131, the case 21 can be pulled out of the shell 11 through the handle 23. In addition, the case 21 abuts the fastening pillar 1131 through the second mating arm 2341, and the case can be securely disposed in the shell 11. The interaction between the handle 1111 and the combination shell 30 is similar to the interaction between the handle 23 of the fan module 20 and the shell 11, and therefore it is not repeated hereinafter.

In summary, the power supply having detachable fan has the following advantages: the plurality of compartments within the shell allows individual fan module to be allocated in one of the compartments. Therefore, when the fan module is out of order, one the fan module not working properly has to be removed without taking all the fan modules out at the same time. The second mating arm abuts the fastening pillar, such that when the fan module is at the first state, the fan module can firmly disposed in the shell without the presence of conventional screws. By using the force between the first mating arm and the fastening pillar, the handle can be rotated and the fan module moves. The deposition of alignment pillar confines the rotation angle of the handle to avoid damage caused by over swung. The flexible electrically conductive arm abuts the inner face of the shell to prevent EMI leakage from the fan module and the power supply main body 10.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A power supply having detachable fan comprising:
   a power supply main body including a shell, wherein walls of the shell define at least one compartment, the walls have at least one fastening portion; and
   a fan module including:
     a case having an outlet and an inlet, the case movably disposed in the compartment, the inlet facing an interior of the shell;
     a fan disposed between the outlet and the inlet; and
     a handle pivotally connected to two sides of the outlet of the case, two ends of the handle respectively having a mating portion, the mating portion and the fastening portion of the immediately adjacent wall of the shell being engaged;
   wherein the handle has a coupling element, the coupling element is detachably coupled to the outlet.

2. The power supply having detachable fan according to claim 1, wherein the handle has a holding portion, a pivot position of the handle is disposed in between the mating portion and the holding portion, the handle rotates about an axis by the pivot portion.

3. The power supply having detachable fan according to claim 2, wherein the fastening portion has a fastening pillar, the mating portion has a first mating arm and a second mating arm, the fastening pillar is disposed between the first mating arm and the second mating arm.

4. The power supply having detachable fan according to claim 3, wherein the fan module has a first state and a second state, when the fan module is at a first state, a level of a force between the first mating arm and the fastening pillar is the same as a level of a force between the second mating arm and the fastening pillar, when the fan module is at the second state, the level of the force between the first mating arm and the fastening pillar is greater than the level of the force between the second mating arm and the fastening pillar.

5. The power supply having detachable fan according to claim 4, wherein an inner side of the handle has an alignment pillar, when the fan module is at the second state, the alignment pillar abuts the outlet.

6. The power supply having detachable fan according to claim 1, wherein the case has at least one flexible electrically conductive arm, the flexible electrically conductive arm flexibly abuts an inner face of the shell.

* * * * *